(12) United States Patent
Lee et al.

(10) Patent No.: US 7,670,900 B2
(45) Date of Patent: Mar. 2, 2010

(54) METHOD AND STRUCTURE FOR FABRICATING CAPACITOR DEVICES FOR INTEGRATED CIRCUITS

(75) Inventors: Roger Lee, Eagle, ID (US); Guoqing Chen, Tucson, AZ (US); Fumitake Mieno, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/549,118

(22) Filed: Oct. 13, 2006
(Under 37 CFR 1.47)

(65) Prior Publication Data

US 2008/0135906 A1    Jun. 12, 2008

(30) Foreign Application Priority Data

Nov. 30, 2005 (CN) .................. 2005 1 0111134

(51) Int. Cl.
*H01L 21/8242* (2006.01)
(52) U.S. Cl. .................. 438/243; 438/253; 438/255; 257/301; 257/306
(58) Field of Classification Search .......... 438/243, 438/253, 255, 396; 257/301, 306, E21.008–E21.021, 257/E21.364
See application file for complete search history.

(56) References Cited

U.S. PATENT DOCUMENTS 5,792,689 A * 8/1998 Yang et al. ............... 438/253

6,046,083 A * 4/2000 Lin et al. .................. 438/255

* cited by examiner

*Primary Examiner*—Theresa T Doan
(74) *Attorney, Agent, or Firm*—Townsend and Townsend and Crew LLP

(57) ABSTRACT

A dynamic random access memory device including a capacitor structure, e.g., trench, stack. The device includes a substrate (e.g., silicon, silicon on insulator, epitaxial silicon) having a surface region. The device includes an interlayer dielectric region overlying the surface region. In a preferred embodiment, the interlayer dielectric region has an upper surface and a lower surface. The device has a container structure within a portion of the interlayer dielectric region. The container structure extends from the upper surface to the lower surface. The container structure has a first width at the upper surface and a second width at the lower surface. The container structure has an inner region extending from the upper surface to the lower surface. In a specific embodiment, the container structure has a higher dopant concentration within a portion of the inner region within a vicinity of the lower surface and on a portion of the inner region near the vicinity of the lower surface. The device also has a doped polysilicon layer overlying the inner region of the trench structure. The device has a first hemispherical grained silicon material having a first grain dimension near the vicinity of the lower surface and a second hemispherical grained silicon material having a second grain dimension near a vicinity of the upper surface of the container structure. In a preferred embodiment, the first grain dimension has an average size of no greater than about ½ of an average size of the second grain dimension to prevent any bridging of any portions of the hemispherical grained silicon material within the vicinity of the lower surface.

12 Claims, 6 Drawing Sheets

METHOD AND STRUCTURE FOR FABRICATING CAPACITOR DEVICES FOR INTEGRATED CIRCUITS

This patent application claims priority to Chinese patent application Ser. No. 200510111133.7 filed on Nov. 30, 2005, commonly assigned, and hereby incorporated by reference for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed to integrated circuits and their processing for the manufacture of semiconductor devices. More particularly, the invention provides a method and device for manufacturing a stack capacitor of a dynamic random access memory device, commonly called DRAMs, but it would be recognized that the invention has a much broader range of applicability. For example, the invention can be applied to other devices having stack capacitor designs and/or like structures.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of capacitor structure for memory devices. Such capacitor structures include, among others, trench capacitor, and stack capacitor designs. Although there have been significant improvements, such designs still have many limitations. As merely an example, these designs must become smaller and smaller but still require large voltage storage requirements. Additionally, these capacitor designs are often difficult to manufacture and generally require complex manufacturing processes and structures, which lead to inefficiencies and may cause low yields. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and device for manufacturing a stack capacitor of a dynamic random access memory device, commonly called DRAMs, but it would be recognized that the invention has a much broader range of applicability. For example, the invention can be applied to other devices having stack capacitor designs and/or like structures.

In a specific embodiment, the present invention provides a method for forming a capacitor structure, e.g., trench, stack. The method includes providing a substrate (e.g., silicon, silicon on insulator, epitaxial silicon) having a surface region. The method includes forming an interlayer dielectric region overlying the surface region. In a preferred embodiment, the interlayer dielectric region has an upper surface and a lower surface. The method also includes forming a container structure within a portion of the interlayer dielectric region. The container structure extends from the upper surface to the lower surface. The container structure has a first width at the upper surface and a second width at the lower surface. The container structure has an inner region extending from the upper surface to the lower surface. In a specific embodiment, the container structure has a higher dopant concentration within a portion of the inner region within a vicinity of the lower surface and on a portion of the inner region near the vicinity of the lower surface. The method includes forming a doped polysilicon layer overlying the inner region of the trench structure and forming a layer of undoped polysilicon material overlying the doped polysilicon layer overlying the inner region. The method forms a seed layer overlying the undoped polysilicon material. The method causes formation of hemispherical grained silicon material having a first grain dimension near the vicinity of the lower surface and formation of hemispherical grained silicon material having a second grain dimension near a vicinity of the upper surface of the container structure. In a preferred embodiment, the first grain dimension has an average size of no greater than about ½ of an average size of the second grain dimension to prevent any bridging of any portions of the hemispherical grained silicon material within the vicinity of the lower surface.

In a specific embodiment, the present invention provides a dynamic random access memory device including a capacitor structure, e.g., trench, stack. The device includes a substrate (e.g., silicon, silicon on insulator, epitaxial silicon) having a surface region. The device includes an interlayer dielectric region overlying the surface region. In a preferred embodiment, the interlayer dielectric region has an upper surface and a lower surface. The device has a container structure within a portion of the interlayer dielectric region. The container structure extends from the upper surface to the lower surface. The container structure has a first width at the upper surface and a second width at the lower surface. The container structure has an inner region extending from the upper surface to the lower surface. In a specific embodiment, the container structure has a higher dopant concentration within a portion of the inner region within a vicinity of the lower surface and on a portion of the inner region near the vicinity of the lower surface. The device also has a doped polysilicon layer overlying the inner region of the trench structure. The device has a first hemispherical grained silicon material having a first grain dimension near the vicinity of the lower surface and a second hemispherical grained silicon material having a second grain dimension near a vicinity of the upper surface of the container structure. In a preferred embodiment, the first grain dimension has an average size of no greater than about ½ of an average size of the second grain dimension to prevent any bridging of any portions of the hemispherical grained silicon material within the vicinity of the lower surface. Depending upon the embodiment, the first grain dimension ranges from about 20 to about 50 nanometers and the second grain dimension ranges from about 50 to about 100 nanometers.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and device for manufacturing a stack capacitor of a dynamic random access memory device, commonly called DRAMs, but it would be recognized that the invention has a much broader range of applicability. For example, the invention can be applied to other devices having stack capacitor designs and/or like structures.

Figure 1:
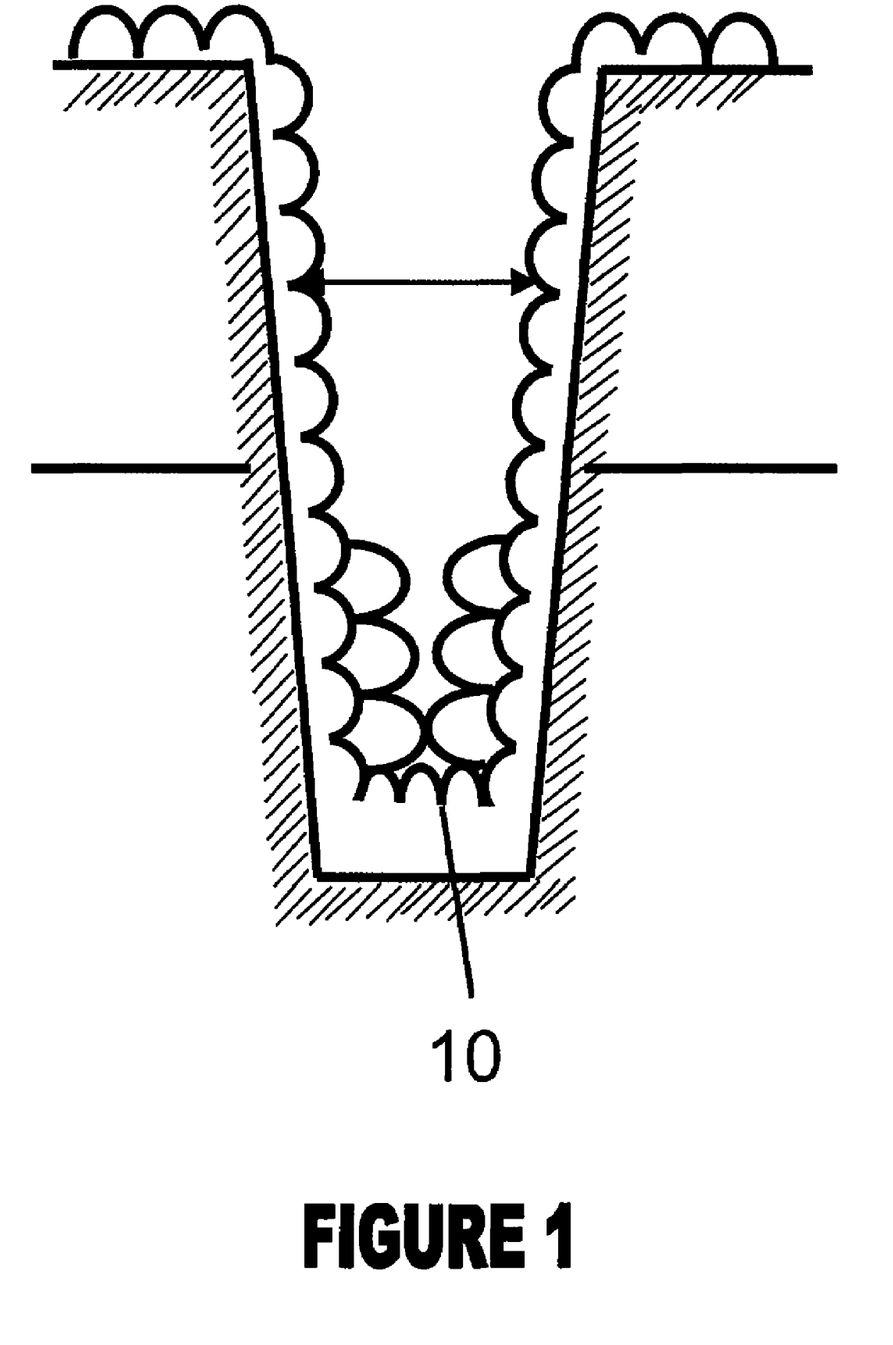
FIG. 1 is a simplified diagram of conventional capacitor structures.

As a dynamic random access memory device scales down to a design rule of about 130 nm and less, it becomes more and more challenging to grow hemispherical grained silicon, commonly called HSG, inside the capacitor cylinders, especially at the lower part and the bottom of the cylinder. Certain limitations exist. As merely an example, the capacitance drops seriously due to merging and/or shorting of the HSG grains in the vicinity of the lower part of the cylinder, as illustrated by FIG. 1, for example. As shown, the grain structure 10 near a bottom portion of the capacitor structure merges together with other grain structure regions. Several methods have been proposed to solve this limitation: Two layers of the ILD are deposited with lower one as BPSG. After patterning the capacitors, the bottom critical dimension (CD) is enlarged by wet treatment that etches BPSG faster than the top ILD. Unfortunately, wet treatment is often difficult to control accurately.

Accordingly, we have provided methods and structures herein. In a specific embodiment, phosphorous is implanted into portions of the cylinder capacitor structure after the undoped polysilicon is deposited. On top of it, an HSG seeding is deposited and HSG grains are grown on the seeding layer. Since the phosphorous impurities at the bottom of the cylinder enhances the HSG seeding speed, there are more but smaller HSG grains on the cylinder bottom. In this way, the HSG grain merging issue is improved. Phosphorous implanting through such a deep hole (over 2 μm deep with aspect ratio of about 20) is not efficient. Moreover, the implanting often causes certain damages on the bottom poly plugs.

In a specific embodiment, the present invention provides a method and structure for HSG grain size control at a vicinity of a bottom portion of a cylinder capacitor structure. Higher phosphorus concentration is employed at the last stage of the poly plug (e.g., P3C1 poly). The higher concentration of the phosphorous will be used as the phosphorous source of the cylinder polysilicon. After formation of the capacitor cylinder holes, undoped polysilicon is doped. Before the HSG seeding the grain growing, a high temperature annealing is performed to move the phosphorous to the undoped poly surface. At the same time, the phosphorus inside the BPSG is also driven to the undoped poly surface. As stated above, this phosphorous acts as a HSG seeding promoter. Smaller HSG grain size is obtained. Further details of the present method and resulting structure can be found throughout the present specification and more particularly below.

A method for fabricating a capacitor structure for a memory device according to an embodiment of the present invention may be outlined as follows:

1. Provide a substrate, e.g., silicon, silicon on insulator, epitaxial silicon, having a surface region;
2. Form an interlayer dielectric region overlying the surface region;
3. Form a container structure within a portion of the interlayer dielectric region, the container structure extending from the upper surface to the lower surface, having a first width at the upper surface and a second width at the lower surface, having an inner region extending from the upper surface to the lower surface;
4. Form a higher dopant concentration within a portion of the inner region within a vicinity of the lower surface and on a portion of the inner region near the vicinity of the lower surface;
5. Form a doped polysilicon layer overlying the inner region of the trench structure;
6. Form a layer of undoped polysilicon material overlying the doped polysilicon layer overlying the inner region;
7. Form a seed layer overlying the undoped polysilicon material;
8. Cause formation of hemispherical grained silicon material having a first grain dimension near the vicinity of the lower surface and formation of hemispherical grained silicon material having a second grain dimension near a vicinity of the upper surface of the container structure;
9. Maintain the first grain dimension at an average size of no greater than about ½ of an average size of the second grain dimension to prevent any bridging of any portions of the hemispherical grained silicon material within the vicinity of the lower surface;
10. Form a capacitor dielectric material overlying the hemispherical grained silicon;
11. Form an upper capacitor plate overlying the capacitor dielectric material to form a capacitor structure; and
12. Perform other steps, as desired.

The above sequence of steps provides a method according to an embodiment of the present invention. As shown, the method uses a combination of steps including a way of forming a capacitor structure with improved capacitance features according to a specific embodiment. More particularly, the present invention provides for different sized HSG structures to prevent any shorting and/or merging of inner portions of a capacitor structure such as a stack and/or trench capacitor structure according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIGS. 2 through 8 illustrate a method for forming an interconnect structure according to an embodiment of the present invention. These diagrams are merely examples, which should not unduly limit the scope of the claims herein. One of ordinary skill in the art would recognize many variations, alternatives, and modifications. As shown is a method for fabricating semiconductor devices. The method includes providing a semiconductor substrate 100, e.g., silicon wafer, which is on a partially completed device structure. The substrate includes a plurality of MOS devices 101 thereon, including source and drain regions, which couple via plug structure 105, to a capacitor structure. Each of the device include sidewall spacer structures 103. Of course, there can be other elements.

Figure 2:
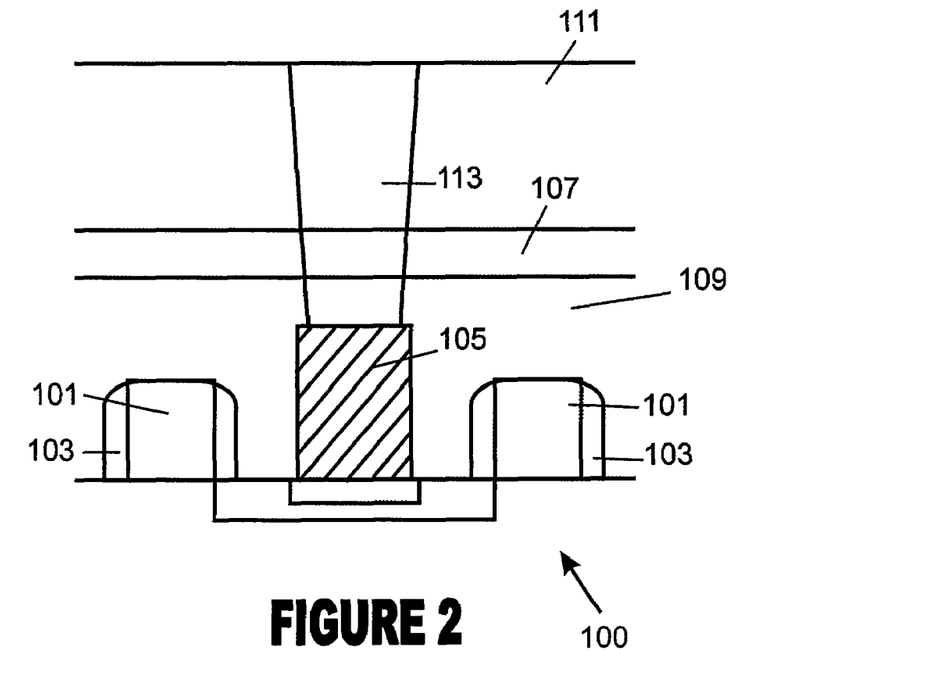
FIGS. 2 through 8 are simplified diagrams illustrating a method for forming a capacitor structure according to embodiments of the present invention

In a specific embodiment, the device includes an inter metal dielectric layer 109, which is formed overlying the device structure. In a specific embodiment, the interlayer dielectric material can be a borophosphosilicate glass, a phosphosilicate glass, a fluorinated glass, an undoped glass, or any combination of these materials and the like. Of course, one of ordinary skill in the art would recognize other variations, modifications, and alternatives. A bit line structure 107 is formed overlying the interlayer dielectric layer according to a specific embodiment. The bit line structure can be formed using a suitable material such as doped polysilicon, tungsten, or other combinations according to a specific embodiment. Overlying the bit line is a second interlayer dielectric material 111, which includes a capacitor contact opening 113. In a specific embodiment, the dielectric material is a suitable material such as tetra-ethyl-ortho-silicate, or equivalently tetra-ethoxy-silane, commonly known as "TEOS."

Figure 3:
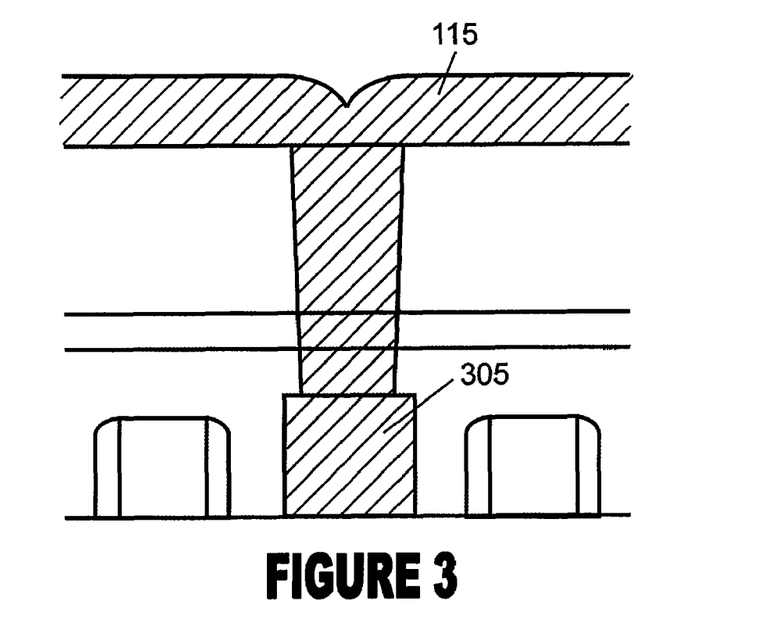
Figure 4:
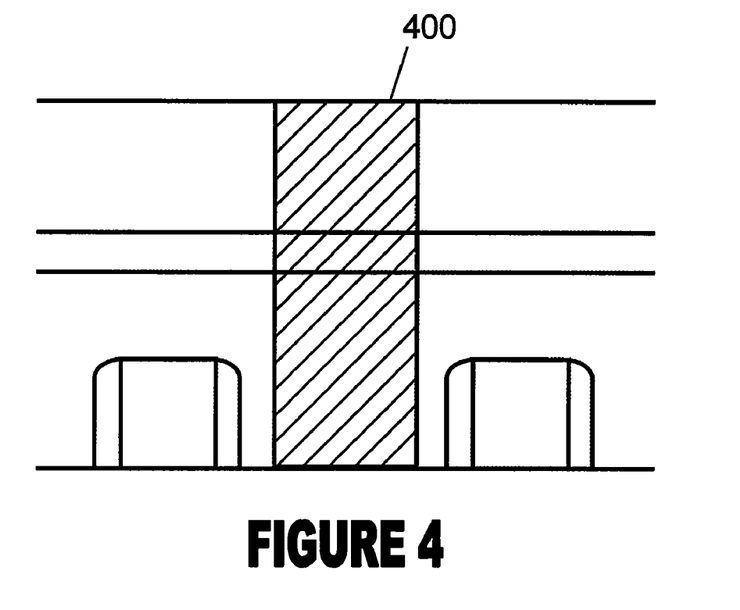

Referring to FIG. 3, the method includes depositing a polysilicon layer overlying the TEOS layer to fill the contact region according to a specific embodiment. The polysilicon layer can be an in-situ doped layer, including a phosphorus impurity, according to a specific embodiment. The polysilicon layer fills the contact region to form a plug structure 115, which couples to plug structure 305 according to a specific embodiment. Referring to FIG. 4, the method planarizes the polysilicon layer using a chemical mechanical polishing process that stops on the TEOS layer according to a specific embodiment. As shown the plug is substantially flat 400 on the upper portion, which is substantially even with the TEOS layer. Of course, there can be other variations, modifications, and alternatives.

Figure 5:
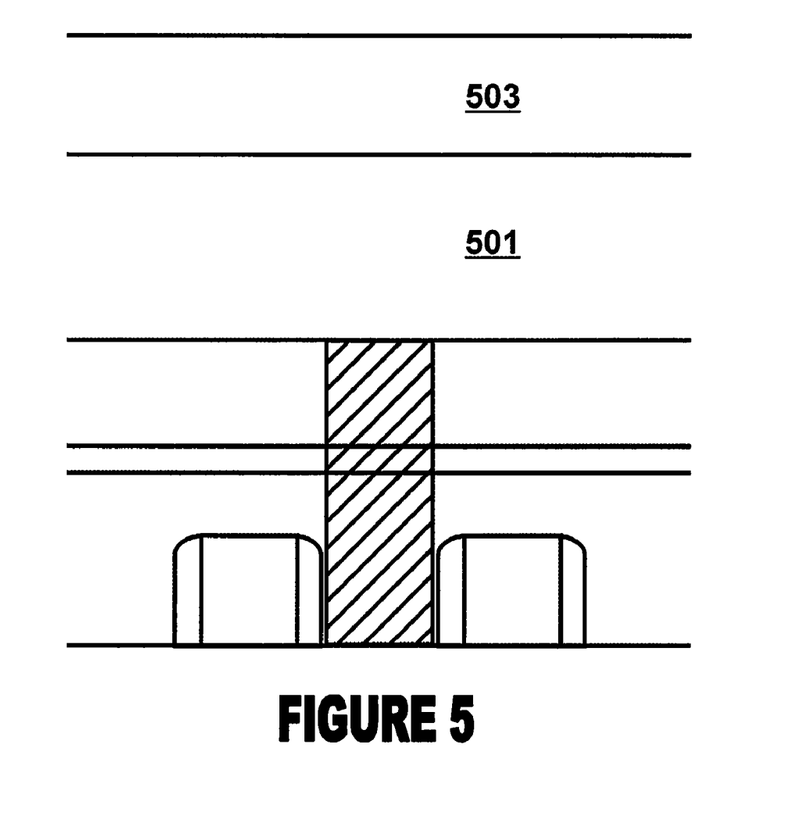

In a specific embodiment, the method includes forming a doped glass layer 501 overlying the TEOS layer, and forming an undoped TEOS layer 503 overlying the doped glass layer, as illustrated by the simplified diagram of FIG. 5. The doped glass layer can be a suitable material such as BPSG, PSG, FSG, and others, depending upon the specific embodiment. The undoped TEOS layer has a substantially flat and planar surface, which can be provided using a chemical mechanical polishing process and/or reflow and/or other technique, depending upon the specific embodiment. Of course, there can be other variations, modifications, and alternatives.

Figure 6:
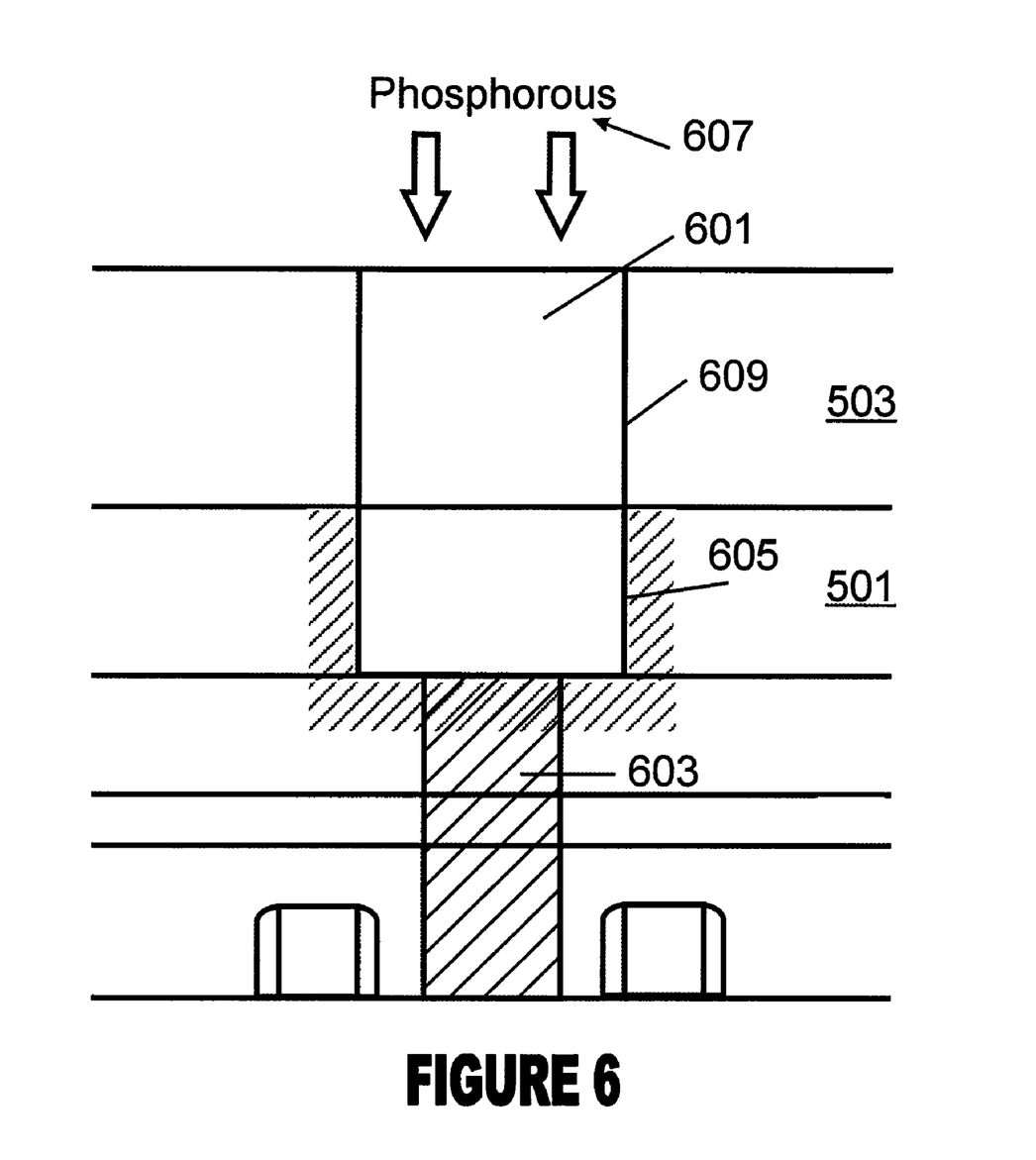

Referring to FIG. 6, the method forms an opening 601 within a portion of layers 503 and 501 according to a specific embodiment. The opening extends from an upper portion of layer 503 to expose the plug structure 603 according to a specific embodiment. The opening would serve as a region for a stacked capacitor structure, which will be described in more detail below. Of course, there can be other variations, modifications, and alternatives. Referring again to FIG. 6, the method introduces impurities 607 into a bottom portion 605 and on top of plug structure 603, which is made essentially of polysilicon material. In a specific embodiment, the impurities are provided using an implantation process. The impurities include a phosphorus at a concentration ranging from about 5E15 atoms/cm2 and at an energy of about 50 keV to about 100 keV according to a specific embodiment. Other regions 609 of the exposes surfaces of the opening have a much lower concentration of impurities and/or are substantially free from impurities according to a specific embodiment. Of course, there can be other variations, modifications, and alternatives.

In a specific embodiment, the method can use a thermal treatment to drive in the phosphorous impurities. That is, a thermal treatment, including furnace and/or rapid thermal anneal, can be used to drive the impurities into regions of the BPSG 501 and plug structure 603 according to a specific embodiment. Of course, there can be other variations, modifications, and alternatives.

Figure 7:
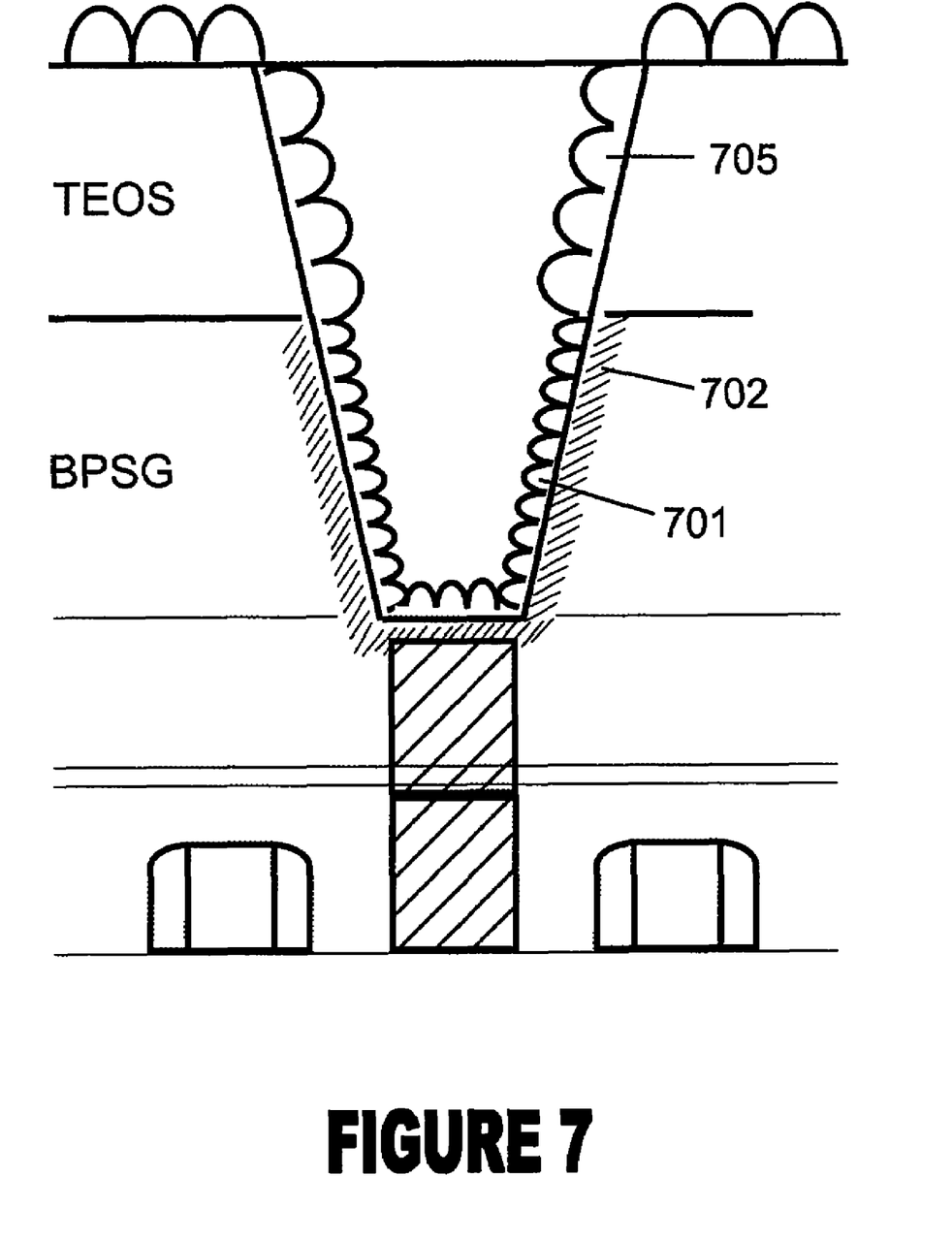

Referring to FIG. 7, the method also includes forming a container structure within a portion of the interlayer dielectric region, which includes the BPSG and TEOS layers. The container structure extends from the upper surface to the lower surface. The container structure has a first width at the upper surface and a second width at the lower surface. The container structure has an inner region extending from the upper surface to the lower surface. In a specific embodiment, the container structure has a higher dopant concentration 702 within a portion of the inner region within a vicinity of the lower surface and on a portion of the inner region near the vicinity of the lower surface.

In a specific embodiment, the method forms hemispherical grained silicon, commonly called HSG, within portions of the container structure. In a specific embodiment, the method includes forming a doped polysilicon layer overlying the inner region of the container structure and forming a layer of undoped polysilicon material overlying the doped polysilicon layer overlying the inner region. The method forms a seed layer overlying the undoped polysilicon material.

In a specific embodiment, the method causes formation of hemispherical grained silicon material having a first grain dimension near the vicinity of the lower surface and formation of hemispherical grained silicon material having a second grain dimension near a vicinity of the upper surface of the container structure. In a preferred embodiment, the first grain dimension 701 has an average size of no greater than about ½ of an average size of the second grain dimension 705 to prevent any bridging of any portions of the hemispherical grained silicon material within the vicinity of the lower surface. In a preferred embodiment, the HSG silicon forms a first electrode member. In a specific embodiment, the HSG is formed using a thermal treatment of the seed layer, undoped polysilicon layer, and doped polysilicon layer according to a specific embodiment. That is, the thermal annealing process has a temperature ranging from about 600 to about 700 Degrees Celsius for a time period ranging from about 30 minutes to about 1 hour. Of course, there can be other variations, modifications, and alternatives.

Figure 8:
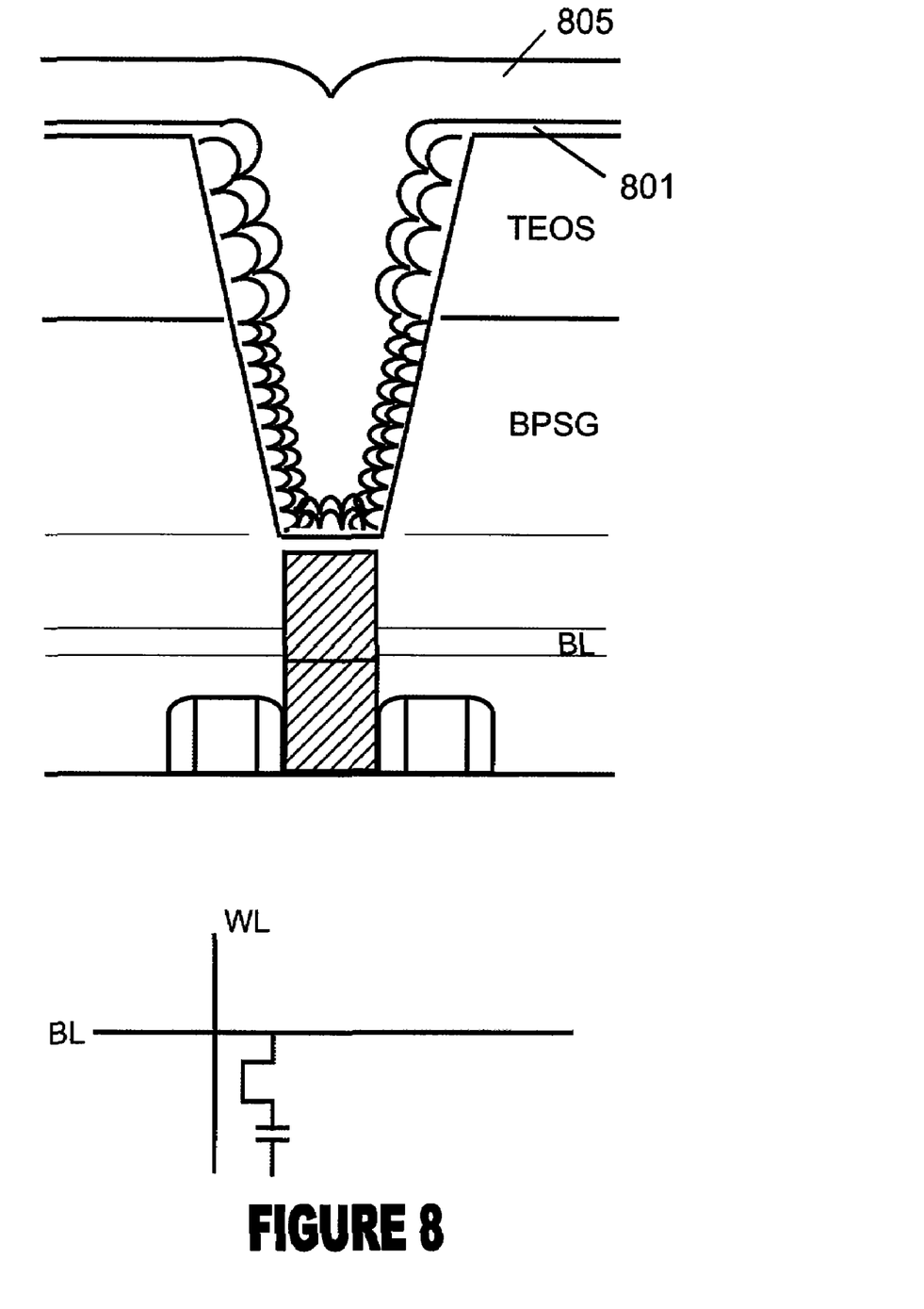

Referring to FIG. 8, the method includes forming a capacitor dielectric material 801 overlying the first electrode member. Depending upon the embodiment, the capacitor dielectric is made of a suitable material or materials such as aluminum oxide ($Al_2O_3$), hafnium oxide ($HfO_2$), silicon nitride (SiN), silicon nitride, $Al_2O_3/HfO_2$, $AlN_yO_x$, $ZrO_2$, $Ta_2O_5$, any combinations of these, and the like. These materials can be deposited using atomic layer deposition, chemical vapor deposition, reactive sputtering and/or chemical deposition according to a specific embodiment. Of course, there can be other variations, modifications, and alternatives.

In a specific embodiment, the method includes forming a second electrode member 805 overlying the capacitor dielectric material. The second electrode member is initially provided as an amorphous silicon material, which is deposited at a temperature of less than 525 Degrees Celsius. In a preferred embodiment, the amorphous silicon material is doped using an impurity such as phosphorus or the like. The amorphous silicon material is often blanket deposited and subject to chemical mechanical polishing or the like. The amorphous material is crystallized to form a polysilicon material, which serves as the second electrode of the capacitor according to a specific embodiment. Of course, there can be other variations, modifications, and alternatives.

The above sequence of steps provides a method according to an embodiment of the present invention. As shown, the method uses a combination of steps including a way of forming a capacitor structure with improved capacitance features according to a specific embodiment. More particularly, the present invention provides for different sized HSG structures to prevent any shorting and/or merging of inner portions of a capacitor structure such as a stack and/or trench capacitor structure according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a capacitor structure, the method comprising:
    providing a substrate having a surface region;
    forming an interlayer dielectric region overlying the surface region, the interlayer dielectric region having an upper surface and a lower surface;
    forming a container structure within a portion of the interlayer dielectric region, the container structure extending from the upper surface to the lower surface, the container structure having a first width at the upper surface and a second width at the lower surface, the container structure having an inner region extending from the upper surface to the lower surface, the container structure having a higher dopant concentration within a portion of the inner region within a vicinity of the lower surface and on a portion of the inner region near the vicinity of the lower surface;
    forming a doped polysilicon layer overlying the inner region of the trench structure;
    forming a layer of undoped polysilicon material overlying the doped polysilicon layer overlying the inner region;
    forming a seed layer overlying the undoped polysilicon material; and
    causing formation of hemispherical grained silicon material having a first grain dimension near the vicinity of the lower surface and formation of hemispherical grained silicon material having a second grain dimension near a vicinity of the upper surface of the container structure;
    whereupon the first grain dimension has an average size of no greater than about ½ of an average size of the second grain dimension to prevent any bridging of any portions of the hemispherical grained silicon material within the vicinity of the lower surface.

2. The method of claim 1 wherein the container structure is characterized by a depth of 3 microns and greater.

3. The method of claim 1 wherein the interlayer dielectric comprises a single layer.

4. The method of claim 1 wherein the interlayer dielectric comprises multiple layers.

5. The method of claim 1 wherein the interlayer comprising a first insulating layer with a first dopant level and a second insulating layer with a second dopant level overlying the first insulating layer, the first dopant level being greater than the second dopant level.

6. The method of claim 1 wherein the container structure is coupled to a doped polysilicon plug structure formed on a bottom portion of the container structure, the doped polysilicon plug structure causing formation of the hemispherical grained silicon material having the first grain dimension.

7. The method of claim 1 wherein the higher dopant concentration is provided by an implantation process, the higher dopant concentration being about 5E15 atoms/cm2 at an energy of about 50 keV to about 100 keV.

8. The method of claim 1 wherein the first grain dimension ranges from about 20 to about 50 nanometers.

9. The method of claim 1 wherein the second grain dimension ranges from about 50 to about 100 nanometers.

10. The method of claim 1 wherein the container structure is coupled to a transistor structure to form a memory device.

11. The method of claim 1 wherein the causing formation comprises a thermal annealing process having a temperature ranging from about 600 to about 700 Degrees Celsius for a time period ranging from about 30 minutes to about 1 hour.

12. The method of claim 11 wherein the thermal annealing process is provided using a phosphine bearing environment.

* * * * *